United States Patent [19]
Kanda et al.

[11] Patent Number: 5,003,369
[45] Date of Patent: Mar. 26, 1991

[54] THYRISTOR OF OVERVOLTAGE SELF-PROTECTION TYPE

[75] Inventors: Kazuyoshi Kanda; Katsumi Akabane; Tadashi Sakaue, all of Hitachi, Japan

[73] Assignee: Hitachi, Ltd., Tokyo, Japan

[21] Appl. No.: 181,719

[22] Filed: Apr. 14, 1988

[30] Foreign Application Priority Data

Apr. 17, 1987 [JP] Japan .................................. 62-93072

[51] Int. Cl.$^5$ ...................... H01L 29/74; H01L 27/14
[52] U.S. Cl. ........................................ 357/38; 357/30
[58] Field of Search .................................. 357/30, 38

[56] References Cited
U.S. PATENT DOCUMENTS 3,987,476 10/1976 Sittig ..................................... 357/38
4,497,109 2/1985 Huber et al. ......................... 357/38
4,514,898 5/1985 Przybysz et al. .................... 357/38
4,516,315 5/1985 Przybysz et al. .................... 357/38

Primary Examiner—Rolf Hille
Assistant Examiner—Wael Fahmy
Attorney, Agent, or Firm—Antonelli, Terry, Stout & Kraus

[57] ABSTRACT

A thyristor of the overvoltage self-protection type capable of performing a turn-on operation certainly without being damaged even when an overvoltage is applied across the thyristor is disclosed in which a P-base layer is provided with a recess having such a depth as to generate an avalanche in the vicinity of the bottom of the recess when the overvoltage is applied across the thyristor, and a portion of a P$^+$-layer formed on the surface of the recess is kept in contact with an N-emitter layer.

10 Claims, 3 Drawing Sheets

THYRISTOR OF OVERVOLTAGE SELF-PROTECTION TYPE

BACKGROUND OF THE INVENTION

The present invention relates to a thyristor of the overvoltage self-protection type which can be safely turned on without being damaged, even when a forward overvoltage exceeding a breakdown voltage is applied between the anode and cathode of the thyristor.

In a case where a forward overvoltage exceeding a breakdown voltage is applied between the anode and cathode of a thyristor, the thyristor is turned on by the overvoltage at an unfavorable portion thereof which is different from a portion where the thyristor is normally turned on, and may as a result become thermally damaged by an excessive current flowing through the unfavorable portion.

A method of protecting a thyristor against the damage resulting from an overvoltage is to connect an external protection circuit to the thyristor. This method, however, is disadvantageous in that the number of parts used is increased and thus a reduction in reliability and an increase in manufacturing cost thus become unavoidable. Another method of protecting a thyristor against the damage due to an overvoltage is to cause the thyristor itself to have a protective function against the over-voltage. A thyristor having a self-protective function against an overvoltage is called "thyristor of the over-voltage self-protection type".

A typical one of conventional thyristors of the overvoltage self-protection type (referred to as Japanese Laid-Open Patent Application No. JP-A-60-42864) is shown in FIG. 8. Referring to FIG. 8, a semiconductor substrate 1 includes a P-emitter layer 11, an N-base layer 12 contiguous to the P-emitter layer 11 for forming a first PN junction $J_1$, a P-base layer 13 contiguous to the N-base layer 12 for forming a second PN junction $J_2$, a main N-emitter layer 14 contiguous to a portion of the P-base layer 13 for forming a third PN junction $J_3$, and an auxiliary N-emitter layer 15 contiguous to the P-base layer 13 and spaced apart from the main N-emitter layer 14 for forming a fourth PN junction $J_4$. Further, a circular recess 16 is formed in the exposed surface of the P-base layer 13 at a central portion of the exposed surface. The auxiliary N-emitter layer 15 is formed around the recess 16 coaxially therewith, and the main N-emitter layer 14 is arranged on the outside of the auxiliary N-emitter layer 15 coaxially therewith. A P+-surface layer 17 which is higher in impurity concentration than the P-base layer 13, is formed on the surface of the recess 16. Further, in FIG. 8, reference numeral 2 designates an anode kept in ohmic contact with the exposed surface of the P-emitter layer 11, 3 a cathode kept in ohmic contact with the exposed surface of the main N-emitter layer 14, 4 an auxiliary electrode kept in contact with the auxiliary N-emitter layer 15 and the P-base layer 13, and 5 an annular gate electrode provided on the P-base layer 13 between the recess 16 and the auxiliary N-emitter layer 15.

When a forward voltage is applied between the anode 2 and the cathode 3 of a thyristor having the above structure in such a manner that the anode 2 is positive with respect to the cathode 3, a reverse bias voltage is applied across the second PN junction $J_2$, and thus the thyristor is put in a forward blocking state. At this time, a depletion layer is formed in the N-base layer 12 and the P-base layer 13. The limits of the depletion layer are indicated by broken lines in FIG. 8. The depletion layer is extended in the P-base layer 13 so as to go beyond the bottom of the recess 16, but is extended in the P+-surface layer 17 at the recess 16. As a result, a multiplication factor obtained in the vicinity of the recess 16 becomes greater than that obtained in the remaining portion, and thus an avalanche breakdown region is locally formed. When the avalanche voltage breakdown region is initially made conductive by an overvoltage, the initial turn-on current thus produced flows as indicated by lines with an arrow. When viewed from the auxiliary N-emitter layer 15 and the main N-emitter layer 14, the initial turn-on current plays the same role as played by a gate triggering current from the gate electrode 5. Thus, when a thyristor having the structure of FIG. 8 is applied with an overvoltage, the thyristor is turned in accordance with a mechanism similar to a normal turn-on mechanism. That is, a thyristor of the overvoltage self-protection type can be realized by the structure of FIG. 8.

However, the thyristor of the overvoltage self-protection type shown in FIG. 8 has the following drawbacks. That is, the initial turn-on current generated within the P+-layer 17 travels a long distance to reach the auxiliary N-emitter layer 15 or main N-emitter layer 14, and hence is decreased by carrier recombination. Further, the initial turn-on current is spread in the direction of the thickness of the P-base layer 13, and thus a current useful for forward biasing the fourth PN junction between the P-base layer 13 and the auxiliary N-emitter layer 15 is decreased. As a result, an initially conductive region formed by the initial turn-on current is very small and hence the so-called hot spot is readily formed. Thus, there is a fear of the thermal damage to the thyristor.

SUMMARY OF THE INVENTION

An object of the present invention is to provide a thyristor of the overvoltage self-protection type which can be turned on certainly without being damaged even when a forward overvoltage across the thyristor is applied.

Another object of the present invention is to provide a thyristor of the overvoltage self-protection type, in which the initial turn-on current generated at a time when an overvoltage across the thyristor, is applied can contribute efficiently to the turn-on operation of the thyristor.

In order to attain the above objects, the characteristic feature of a thyristor of the overvoltage self-protection type according to the present invention resides in that a recess is formed in the exposed portion of one main surface of one intermediate layer contiguous to one outer layer serving as one emitter, a surface layer of the same in conductivity type to and higher in impurity concentration than the above-said one intermediate layer is formed on the surface of the recess, and one outer layer is kept in contact with the surface layer. It is to be noted that not only a layer serving as one emitter of a thyristor but also a layer serving as one emitter of the auxiliary thyristor portion of a thyristor having the amplifying gate structure is called one outer layer.

When an overvoltage is applied across a thyristor having the above characteristic feature the initial turn on current generated at the bottom of the recess and its neighborhood flows so as to bias a PN junction which is formed between one outer layer and one intermediate layer, efficiently in the forward direction. Thus, the objects of the present invention can be attained.

The depth of the recess formed in accordance with the present invention is set so that the initial turn on current is hardly generated when a voltage substantially equal to a rated value is applied across the thyristor, and the initial turn on current sufficient to turn on the thyristor is generated when such an over-voltage as to necessitate the self-protection of the thyristor is applied across the thyristor. Further, the surface layer is formed on the surface of the recess so that an avalanche breakdown occurs in the surface layer and the initial turn on current thus produced contributes to the turn-on operation of the thyristor efficiently. Accordingly, it is not always required to form the surface layer on the whole surface of the recess.

DESCRIPTION OF THE PREFERRED EMBODIMENTS

Now, explanation will be made of typical embodiments of a thyristor of the overvoltage self-protection type according to the present invention, with reference to the drawings.

Figure 1:
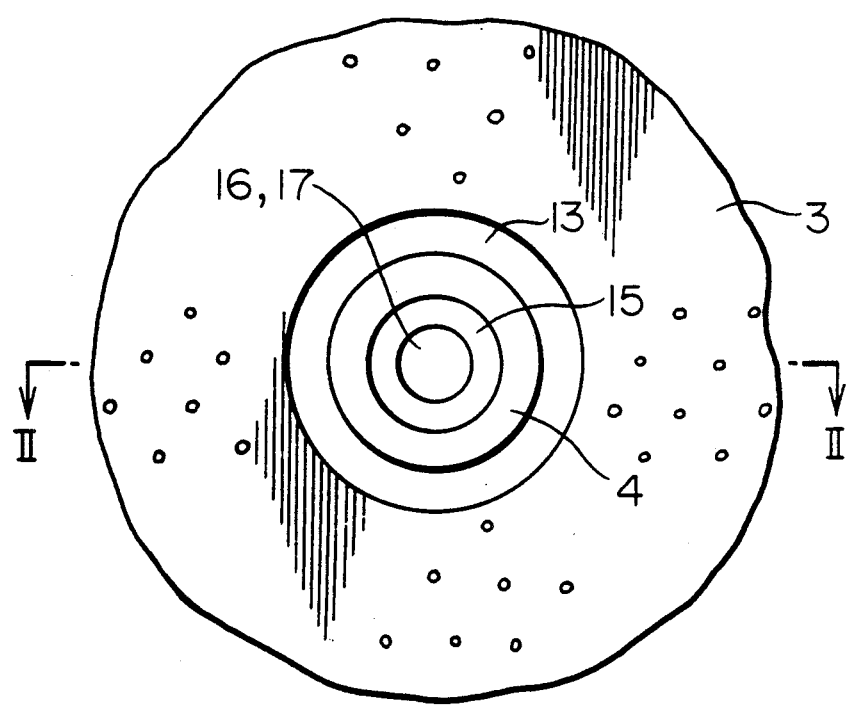
FIG. 1 is a plan view showing an embodiment of a thyristor of the overvoltage self-protection type according to the present invention.
Figure 2:
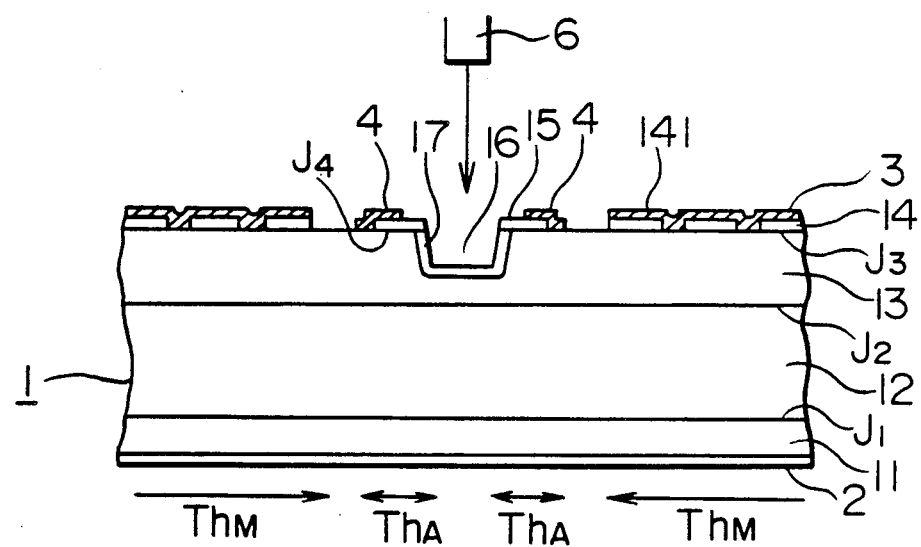
FIG. 2 is a fragmentary sectional view taken along the line II—II of FIG. 1.
Figure 3:
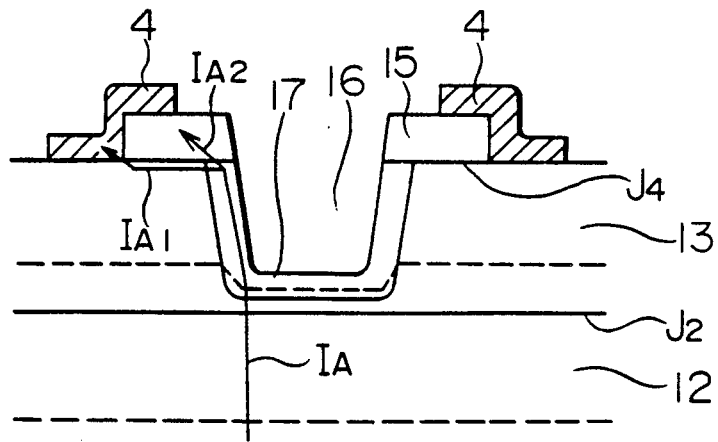
FIG. 3 is an enlarged view of a main part of the embodiment of FIGS. 1 and 2 for explaining the operation of the embodiment.

FIGS. 1 to 3 show an embodiment of a light triggered thyristor (namely, light activated thyristor) according to the present invention. Referring to FIG. 2, a semiconductor substrate 1 includes a P-emitter layer 11, an N-base layer 12 contiguous to the P-emitter layer 11 for forming a first PN junction $J_1$, a P-base layer 13 contiguous to the N-base layer 12 for forming a second PN junction $J_2$, a main N-emitter layer 14 contiguous to a portion of the P-base layer 13 for forming a third PN junction $J_3$, and an auxiliary N-emitter layer 15 contiguous to the P-base layer 13 and spaced apart from the N-main emitter layer 14 for forming a fourth PN junction $J_4$. In FIGS. 1 to 3, reference numeral 16 designates a substantially circular recess formed in the P-base layer 13 at a position where the N-emitter layers 14 and 15 are absent, and 17 a P+-surface layer which is formed on the surface of the recess 16 and is higher in impurity concentration than the P-base layer 13. In more detail, the auxiliary N-emitter layer 15 is formed so that the recess 16 is surrounded by the auxiliary N-emitter layer 15 and a portion thereof is kept in contact with the P+-surface layer 17, and the main N-emitter layer 14 is formed so that the auxiliary N-emitter layer 15 is surrounded by the main N-emitter layer 14 through the exposed surface of the P-base layer 13. Further, in FIGS. 1 to 3, reference numeral 2 designates an anode kept in ohmic contact with the exposed surface of the P-emitter layer 11, 3 a cathode kept in ohmic contact with the main N-emitter layer 14 and kept in ohmic contact with the P-base layer 13 through short-circuiting holes 141 in the main N-emitter layer 14, 4 an auxiliary electrode kept in ohmic contact with the auxiliary N-emitter layer 15 and that exposed surface of the P-base layer 13 which is sandwiched between the auxiliary N-emitter layer 15 and the main N-emitter layer 14, and 6 photo-trigger means (for example, a light emitting diode or optical fiber) for illuminating the recess 16 and the surface of the auxiliary N-emitter layer 15 with light. The depth of the recess 16 is set so that when such an overvoltage as to necessitate the self-protection of the thyristor is applied between the anode 2 and the cathode 3, a depletion layer extending from the second PN junction $J_2$ into the P-base layer 13 is suppressed by the recess 16, and avalanche breakdown occurs in the P+-surface layer 17. In other words, the recess 16 has such a depth as to make the breakdown voltage of that portion of the second PN junction $J_2$ which exists in the vicinity of the recess, lower than the breakdown voltage of the remaining portion of the second PN junction $J_2$. Preferably, the recess 16 is made so deep as to make the thickness of the depletion layer existing under the recess 17 less than or equal to one-half the thickness of the depletion layer existing in the remaining portion.

Next, explanation will be made of the operation of the present embodiment having the above-mentioned structure. The turn-on operation using ordinary trigger means is performed in the following manner. Referring to FIG. 2, a four-layer region (that is, auxiliary thyristor region) $Th_A$ including the auxiliary N-emitter layer 15 as one outer layer, is first turned on by a photo-trigger signal, and the turn-on current thus obtained is used as a trigger current for another four-layer region (that is, main thyristor region) $Th_M$ which includes the main N-emitter layer 14 as one outer layer, to turn on the whole of the main thyristor region $Th_M$. In other words, the present embodiment is turned on by an amplifying gate mechanism.

Next, the turn-on operation of the present embodiment applied with an overvoltage will be explained, with reference to FIG. 3. When an overvoltage across the present embodiment is applied, the initial turn-on current $I_A$ flows in that portion of the P+- surface layer 17 which is formed on the bottom of the recess 16. The initial turn-on current also first flows in the P+-surface layer 17 along the wall of the recess 16, and changes its direction in the vicinity of the boundary between the P+-surface layer 17 and the auxiliary N-emitter layer 15. Thus, as indicated by reference symbol $I_{A1}$, the avalanche current flows in that portion of the P-base layer 13 which exists beneath the auxiliary N-emitter layer 15, in a lateral direction, to reach the auxiliary electrode 4. A PN junction formed between the P+-surface layer 17 and the auxiliary N-emitter layer 15 is biased in the forward direction by the current $I_{A1}$. As a result, the initial turn-on current $I_A$ flows from the P+-surface layer 17 directly into the auxiliary N-emitter layer 15 as indicated by reference symbol $I_{A2}$, to reach the auxiliary electrode 4. Accordingly, the PN junction formed between the P+-surface layer 17 and the auxiliary N-emitter layer 15 is more biased in the forward direction, and thus the four-layer region including the auxiliary N-emitter layer 15 as one outer layer is turned on. The present embodiment, in which the P+-surface layer 17 is kept in contact with the auxiliary N-emitter layer 15, is superior to the conventional thyristor in the following points.

(1) The electric resistance between the initial turn-on current generating portion of the P+-surface layer 17 and the auxiliary N-emitter layer 15 can be made small, and thus the greater part of initial turn-on current can reach the auxiliary electrode 4.

(2) The greater part of initial turn-on current can flow in that portion of the P-base layer 13 which exists beneath the auxiliary N-emitter layer 15, as indicated by the reference symbol $I_{A1}$, and thus the PN junction formed between the auxiliary N-emitter layer 15 and the P-base layer 13 is efficiently biased in the forward direction.

(3) The built-in potential between the auxiliary N-emitter layer 15 and the P surface layer 17 can be made small.

Hence, the turn-on operation of the present embodiment applied with an overvoltage is performed more rapidly at a wider region, as compared with the turn-on operation of the conventional thyristor applied with the overvoltage. Accordingly, even when an over-voltage is applied across the present embodiment, the present embodiment can be surely turned on, and thus is protected against thermal damage.

In order to clearly show the advantages of the present embodiment, the present embodiment and a conventional thyristor formed in accordance with the same specifications were compared with each other. That is, the present embodiment was constructed of a circular semiconductor substrate which had a diameter of 80 mm and included the P-emitter layer having an impurity concentration of $5 \times 10^{16}$ atoms/cm$^3$ and a thickness of 110 μm, the N-base layer having an impurity concentration of $2 \times 10^{13}$ atoms/cm$^3$ and a thickness of 750 μm, the P-base layer having an inpurity concentration of $1 \times 10^{16}$ atoms/cm$^3$ and a thickness of 85 μm, the recess formed in a central portion of the P-base layer and having a diameter of 0.5 mm and a depth of 70 μm, the P+-surface layer formed on the surface of the recess and having an impurity concentration of $1 \times 10^{18}$ atoms/cm$^3$ and a thickness of 8 μm, the annular, auxiliary N-emitter layer kept in contact with the P+-surface layer and having an impurity concentration of $1 \times 10^{20}$ atoms/cm$^3$, a thickness of 10 μm and a width of 1.2 mm, and the annular, main N-emitter layer having an impurity concentration of $1 \times 10^{20}$ atoms/cm$^3$ and a thickness of 10 μm. Further, a thyristor having the conventional structure was prepared in accordance with the above specifications, and the auxiliary N-emitter layer was spaced apart from the P+-surface layer a distance of 1.7 mm. The characteristics of the present embodiment applied with an overvoltage were compared with those of the conventional thyristor applied with the overvoltage, age, as shown in the following table 1. Incidentally, the rated voltage and current of these thyristors were equal to 4,000 V and 1,500 A, respectively, and the overvoltage is from 4,000 V to 4,500 V. The design value of forward breakover voltage of the conventional thyristor which did not have the overvoltage self-protection structure was put in a range from 5,000 to 5,700 V.

TABLE 1

| Characteristics | Present embodiment | Conventional thyristor |
| --- | --- | --- |
| variations in breakover voltage | 400 V | 800 V |
| ratio of excellent goods at switching power test based upon breakover turn on | 10/10 | 6/10 |

Figure 4:
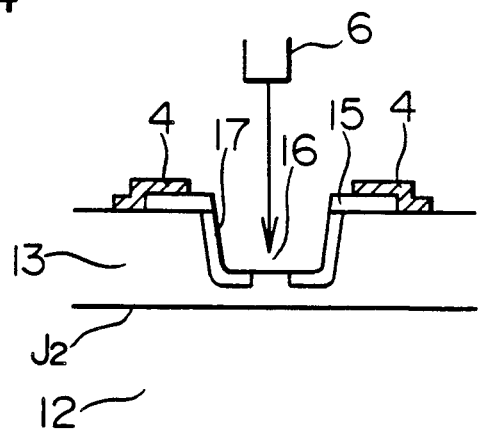
FIGS. 4 and 5 are fragmentary sectional views showing modified versions of the surface layer of FIG. 2.
Figure 5:
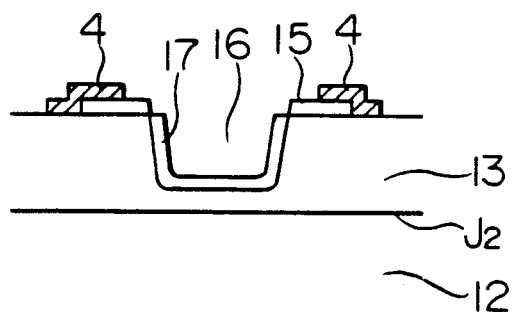

FIGS. 4 and 5 show modified versions of the P+-surface layer. In more detail, FIG. 4 shows a case where at least a portion of the bottom of the recess 16 is not coated with the P+-surface layer 17. In this case, a reduction in triggering sensitivity of a light activated thyristor due to the P+-surface layer 17 can be presented. Further, FIG. 5 shows a case where a point contact is formed between the P+-surface layer 17 and the auxiliary N-emitter layer 15, at their cross section.

Figure 6:
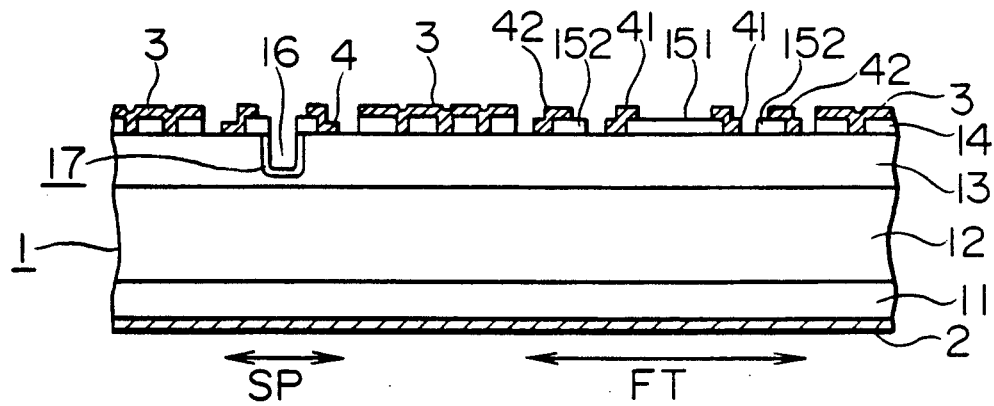
FIG. 6 is a fragmentary sectional view showing another embodiment of a thyristor of the overvoltage self-protection type according to the present invention.

FIG. 6 shows another embodiment of a thyristor of the overvoltage self-protection type according to the present invention, in which embodiment a region having a self-protective function against an overvoltage is separated from a region which is initially turned on by a trigger signal. A region SP having the self-protective function includes the recess 16, the P+-surface layer 17 and the auxiliary N-emitter layer 15, as in FIG. 2. While, a region FT which is initially turned on by a trigger signal, includes a second auxiliary N-emitter layer 151 formed on the P-base layer 13, a third auxiliary N-emitter layer 152 formed around the second auxiliary N-emitter layer 151 and spaced apart therefrom, a second auxiliary electrode 41 kept in ohmic contact with the second auxiliary N-emitter layer 151 and that portion of the P-base layer 13 which exists in the vicinity of the second auxiliary N-emitter layer 151, and a third auxiliary electrode 42 kept in ohmic contact with the third auxiliary N-emitter layer 152 and that portion of the P-base layer 13 which exists in the vicinity of the third auxiliary N-emitter layer 152. The surface of the second auxiliary N-emitter layer 151 receives a photo-trigger signal. When the region SP is separated from the region FT as mentioned above, the design of each of the regions SP and FT can be readily made optimum.

Although a light activated thyristor is shown in FIG. 6, this thyristor can be converted into a thyristor having an electrical gate by removing the second auxiliary N-emitter layer 151 and the second auxiliary electrode 41 from the region FT, and by providing a gate electrode on the P-base layer 13 at the position of the second auxiliary N-emitter layer 151 and the second auxiliary electrode 41.

Figure 7:
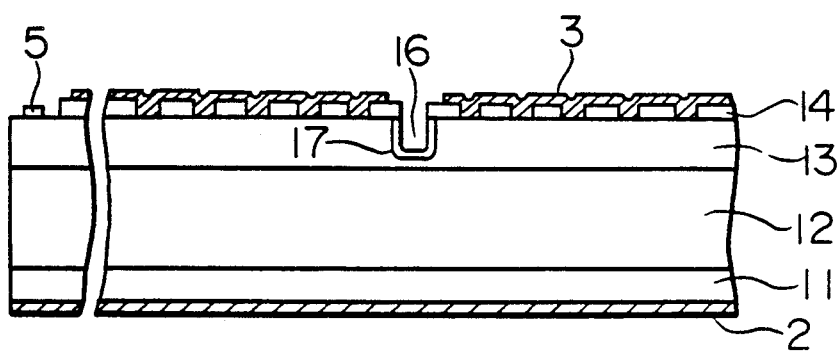
FIG. 7 is a fragmentary sectional view-showing a further embodiment of a thyristor of the overvoltage self-protection type according to the present invention.
Figure 8:
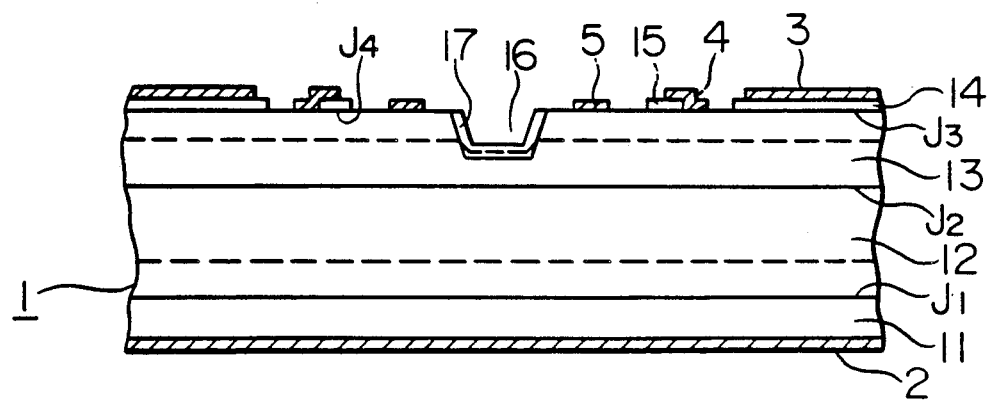
FIG. 8 is a fragmentary sectional view showing a conventional thyristor of the overvoltage self-protection type.

FIG. 7 shows a further embodiment of a thyristor of the overvoltage self-protection type according to the present invention which embodiment is small in current capacity. The present embodiment is different from the embodiments of FIGS. 2 and 6 in that the turnon mechanism using the initial turn-on current and a gate signal current includes no amplifying operation.

Although a few embodiments of a thyristor according to the present invention have been explained, the present invention is not limited to these embodiments, but many variations and modifications are possible without departing from the spirit and scope of the invention. Further, the present invention is applicable to a gate turn-off thyristor, a bi-directional thyristor, a reverse conducting thyristor, and others.

As has been explained in the foregoing, according to the present invention, the initial turn-on current generated in the P+-surface layer can contribute efficiently to a turn-on operation, and the built-in potential at a region which is first turned on by the initial turn-on current, can be made low. Thus, a self-protective function against an overvoltage can be surely performed.

We claim:

1. A thyristor of the overvoltage self-protection type comprising:
   a first semiconductor layer of a first conductivity type;
   a second semiconductor layer of a second conductivity type contiguous to the first semiconductor layer for forming a first PN junction between the first and second semiconductor layers;
   a third semiconductor layer of the first conductivity type contiguous to the second semiconductor layer for forming a second PN junction between the second and third semiconductor layers;
   a fourth semiconductor layer of the second conductivity type contiguous to a portion of the third semiconductor layer for forming a third PN junction between the third and fourth semiconductor layers;
   a recess formed in the remaining portion of the third semiconductor layer so as to be extended from a surface of the third semiconductor layer, which surface is contiguous to said fourth semiconductor layer, toward the second semiconductor layer;
   a surface layer of the first conductivity type formed on the surface of the recess, said surface layer being extended along the surface of said recess so that a portion of the surface layer is contiguous to the fourth semiconductor layer, the surface layer being higher in impurity concentration than the third semiconductor layer;
   a first main electrode kept in ohmic contact with the surface of the first semiconductor layer;
   a second main electrode kept in ohmic contact with the surface of the fourth semiconductor layer; and
   trigger means for supplying a turn-on signal to at least one semiconductor layer selected from the first, second, third and fourth semiconductor layers.

2. A thyristor of the overvoltage self-protection type according to claim 1, wherein the recess has such a depth as to make the breakdown voltage of that portion of the second PN junction which exists in the vicinity of the recess, lower than the breakdown voltage of the remaining portion of the second PN junction.

3. A thyristor of the overvoltage self-protection type according to claim 1, wherein the fourth semiconductor layer is separated into a first region which is formed so that the recess is surrounded by the first region, and a second region which is spaced apart from the first region and is formed so that the first region is surrounded by the second region, and wherein the second main electrode is kept in ohmic contact with the second region, and an auxiliary electrode is kept in contact with the first region and that portion of the third semiconductor layer which is sandwiched between the first and second regions.

4. A thyristor of the overvoltage self-protection type according to claim 3, wherein the surface layer is formed on the whole surface of the recess.

5. A thyristor of the overvoltage self-protection type according to claim 3, wherein the recess has such a depth as to make the breakdown voltage of that portion of the second PN junction which exists in the vicinity of the recess, lower than the breakdown voltage of the remaining portion of the second PN junction.

6. A thyristor of the overvoltage self-protection type according to claim 1, wherein the surface layer is formed all over the surface of the recess except a portion of the bottom of the recess, and wherein the trigger means supplies a photo-trigger signal to the recess.

7. A thyristor of the overvoltage self-protection type according to claim 5, wherein the surface layer is formed on the whole surface of the recess.

8. A thyristor of the overvoltage self-protection type according to claim 7, wherein the first and the second conductivity types are P and N-type conductivity, respectively.

9. A thyristor of the overvoltage self-protection type according to claim 1, wherein the one and the other conductivity types are P and N-type conductivity, respectively.

10. A thyristor of the overvoltage self-protection type according to claim 3, wherein the surface layer is formed all over the surface of the recess except a portion of the bottom of the recess, and wherein the trigger means supplies a photo-trigger signal to the recess.

* * * * *